United States Patent [19]

Tachikiri et al.

[11] Patent Number: 5,519,324

[45] Date of Patent: May 21, 1996

[54] WITHSTAND VOLTAGE-TESTING APPARATUS

[75] Inventors: Hiroto Tachikiri; Yoshiyuki Hattori; Koji Suzuki; Tadashi Sugino, all of Yokkaichi, Japan

[73] Assignee: Sumitomo Wiring Systems, Ltd., Yokkaichi, Japan

[21] Appl. No.: 327,786

[22] Filed: Oct. 20, 1994

[30] Foreign Application Priority Data

Dec. 1, 1993 [JP] Japan .................................. 5-302098

[51] Int. Cl.⁶ .................................................. G01R 31/02
[52] U.S. Cl. .......................... 324/551; 324/509; 324/544; 340/650
[58] Field of Search ................................. 324/509, 510, 324/522, 537, 543, 544, 551; 340/650, 661, 662, 663

[56] References Cited

U.S. PATENT DOCUMENTS

| | | | |
|---|---|---|---|
| 4,377,782 | 3/1983 | Metcalf et al. | 324/537 |
| 5,128,618 | 7/1992 | Yamada et al. | 324/501 |
| 5,132,629 | 7/1992 | Clinton et al. | 324/544 |

*Primary Examiner*—Kenneth A. Wieder
*Assistant Examiner*—Glenn W. Brown
*Attorney, Agent, or Firm*—Greenblum & Bernstein

[57] ABSTRACT

A withstand voltage-testing apparatus includes a high voltage generator for applying a high voltage to a work, the withstand voltage of which is to be measured. A ground conductor covers the work with an insulating material. A conductor is wound around a current transformer to connect the ground conductor and the ground. A variable resistor is connected with the output terminals of the current transformer. A digital panel meter, which includes a detector, detects a voltage generated by the variable resistor. A warning mechanism displays that work produced by the above is defective when a voltage detected by the detector is higher than a predetermined value.

4 Claims, 3 Drawing Sheets

WITHSTAND VOLTAGE-TESTING APPARATUS

BACKGROUND OF THE INVENTION

1. Field of the Invention

The present invention relates to a withstand voltage-testing apparatus and more particularly to the withstand voltage-testing apparatus preferably used to measure the withstand voltage of a high-voltage component part such as a high-voltage cable or the like connected with an ignition plug of an internal combustion engine. In the apparatus, in order to detect whether electric current has leaked from the high-voltage component part, a current transformer and a resistor are used to convert the leakage current into a voltage, if the leakage current has been generated therein.

2. Description of the Prior Art

The following first and second methods are adopted to measure the withstand voltage of a work such as a high voltage cable connected with an ignition plug of an automobile.

In the first method, an automatic deciding testing apparatus of discharge type shown in FIG. 3 is used. In the second method, an operator checks whether electric current has leaked from the work by using a ground bar, as shown in FIG. 4.

In the automatic deciding testing apparatus of discharge type shown in FIG. 3, a core conductor 2 of a high-voltage cable 1 used as a work is covered with an insulating material 3, and the insulating material 3 is surrounded with a ground conductor 4. As a deciding device, a triple-needle discharge device 5 comprising a positive pole 5a, a negative pole 5b, and a floating pole 5c is used. The positive pole 5a is connected with the core conductor 2, while the negative pole 5b is connected with the ground conductor 4. A high-voltage pulse is applied to the core conductor 2 and the positive pole 5a of the discharge device 5 by a high-voltage pulse generator 6 comprising a high-voltage generation circuit 6a and an oscillation circuit 6b.

In order to decide whether or not electric current has leaked from the high-voltage cable 1 by means of discharge light generated in the gap in the three-pole needle, the apparatus has an optical leakage current-detecting means 8 comprising a light receiving section 8 for receiving the discharge light and a deciding section 9. The light receiving section 8 comprises an optical fiber 8a and a high-speed photodiode 8b which generates an inverse voltage, upon receipt of light introduced to the light receiving section 8 via the optical fiber 8a. The deciding section 9 comprises an OSC synchronization comparator 9a which compares with each other a high-voltage pulse (b) applied to the core conductor 2 and the positive pole 5a of the discharge device 5 and the pulse (a) of discharge light applied by the light receiving section 8 so as to check whether both pulses are synchronized with each other; and a deciding circuit 9b for deciding whether the high-voltage cable 1 is defective or undefective, upon receipt of a signal, from the OSC synchronization comparator 9a, indicating that the two pulses have been synchronized with each other or they have not been synchronized with each other.

If no electric current has not leaked from the high-voltage cable 1 in the test, it is decided that the high-voltage pulse (b) and the pulse (a) of the discharge light have been synchronized with each other and thus the high-voltage cable 1 is "undefective" If electric current has leaked from the high-voltage cable 1 because the high-voltage cable 1 has a pin hole or the like thereon, discharge does not take place in the discharge device 5 or unstable discharge light is generated. Consequently, the pulse (a) outputted from the photodiode 8b is not synchronized with the pulse (b). That is, it is decided that the high-voltage cable 1 is "defective".

In the second method shown in FIG. 4, the operator applies a high voltage to the work 1 (high-voltage cable) via a ground bar 10 by applying the latter to the former so as to check visually whether electric current has leaked from the work 1 or not. That is, if the work 1 has a pin hole P thereon, leakage light is generated between the ground bar 10 and the work 1, whereas if the work 1 has no pin hole P thereon and thus if no electric current leaks from the work 1, leakage light is not generated therebetween.

The first testing method, namely, the method to be carried out by using the automatic deciding apparatus of discharge type has the following problems because the three-pole needle is used as the discharge device 5.

(1) It is necessary to change the voltage of the discharge device in correspondence to the change in the voltage to be applied to the work 1. To this end, it is necessary to adjust the length of the gap among the positive pole 5a, the negative pole 5b, and the floating pole 5c of the three-pole needle by changing the positions thereof. Accordingly, it takes much time and labor to conduct tests and further, it is difficult for the apparatus to measure the withstand voltage of the work 1 accurately.

(2) When a high voltage is applied to the work 1, it is necessary to provide a long gap G in the discharge device 5. In this case, unstable discharge light is generated in the gap G. As a result, although the discharge light is continuously generated, there is a possibility that discharge light having regular pulses cannot be generated. In this case, it is decided that the work 1 is insulated defectively.

Accordingly, the upper limit of the voltage to be applied to the work 1 is 25–28 KV. At a voltage higher than 28 KV, a withstand voltage-checking test cannot be conducted by using the discharge device comprising the three-pole needle.

(3) Because discharge is performed in atmosphere by using the discharge device comprising the three-pole needle, a discharge voltage changes by ±5KV and is thus unstable. Consequently, evaluated results are not highly reliable.

(4) Because the discharge is carried out in atmosphere, ozone and a great sound are generated, and hence an unfavorable environment is produced in the periphery of a place in which tests are conducted.

In the second method, whether the work 1 is defective or not is decided visually. Thus, a test result depends on operator's professional skill and experience. Thus, test results are not highly reliable and hence, there is a possibility that a defective work is decided as an undefective work.

SUMMARY OF THE INVENTION

The present invention has been developed with a view to substantially solving the above described disadvantages and has for its essential object to provide an improved testing apparatus capable of detecting electric current which has leaked from a work such as a high-voltage cable or the like without using a testing apparatus of discharge type or operator's visual check, thus automatically deciding whether the work is defective or not.

In order to achieve the aforementioned object, there is provided a withstand voltage-testing apparatus comprising: a high-voltage generating means for applying a high voltage to a work, the withstand voltage of which is to be measured; a ground conductor covering the work with an insulating material; a current transformer around which a conductor connecting the ground conductor and the ground with each other is wound in N-turn; a resistor connected with both output terminals of the current transformer; a detector for detecting a voltage generated by the resistor; and a warning means for displaying that the work is defective when a voltage detected by the detector is higher than a predetermined upper threshold and lower than a predetermined lower threshold.

When electric current has leaked from the work, the current transformer generates electric current corresponding to the leakage current, and electric current outputted from output terminals of the current transformer is flowed through the resistor so as to convert feeble electric current into a voltage. The voltage produced by conversion is detected by the detector so as to decide automatically whether the work is defective or not.

Preferably, a variable resistor is used as the resistor. It is preferable to increase the winding number of times of the conductor to be wound around the current transformer. The current transformer catches feeble electric current reliably, thus generating electric current corresponding to the feeble electric current.

The detector is composed of a DC digital panel meter and a sequencer connected with the digital panel meter. If the voltage inputted to the DC digital panel meter is higher than a predetermined upper threshold, the DC digital panel meter outputs a signal to the sequencer from a High-output terminal thereof, whereas if the voltage is lower than the lower threshold, it outputs a signal from a Low-output terminal thereof. Upon receipt of signals, a lamp of the warning means connected with the sequencer is turned on, thus displaying that the work is defective.

If a voltage generated by the resistor is disposed between the upper threshold and the lower threshold, it is decided that the voltage is generated not by the leakage current but by noise.

According to the above construction, upon application of a high voltage from the high-voltage applying means to the work, leakage current flows from the ground conductor to the ground via the conductor if electric current has leaked from the work. Because the conductor is wound round the current transformer, the current transformer generates electric current corresponding to the leakage current. The electric current generated by the current transformer flows from the output terminals thereof to the resistor which converts feeble electric current into a voltage. The voltage is proportional to the leakage current and inputted to the digital panel meter of the detector. A signal is outputted from the High-output terminal of the digital panel meter or the Low-output terminal thereof to the sequencer. When a signal is inputted to the sequencer from the High-output terminal, it is decided that the work is "defective" and the warning lamp is turned on.

As described above, the testing apparatus according to the present invention detects electric current which has leaked from the work directly and automatically, thus providing a reliable test result.

Further, because the DC digital panel meter is used as the detector, the apparatus can be prevented from malfunctioning due to noise.

Furthermore, the apparatus can overcome various problems of the conventional withstand voltage-testing apparatus comprising the triple-needle discharge device. In addition, the apparatus can be reliably used at a high voltage of 30 KV or more.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE INVENTION

A withstand voltage-testing apparatus according to an embodiment of the present invention is described below with reference to the drawings.

Figure 1:
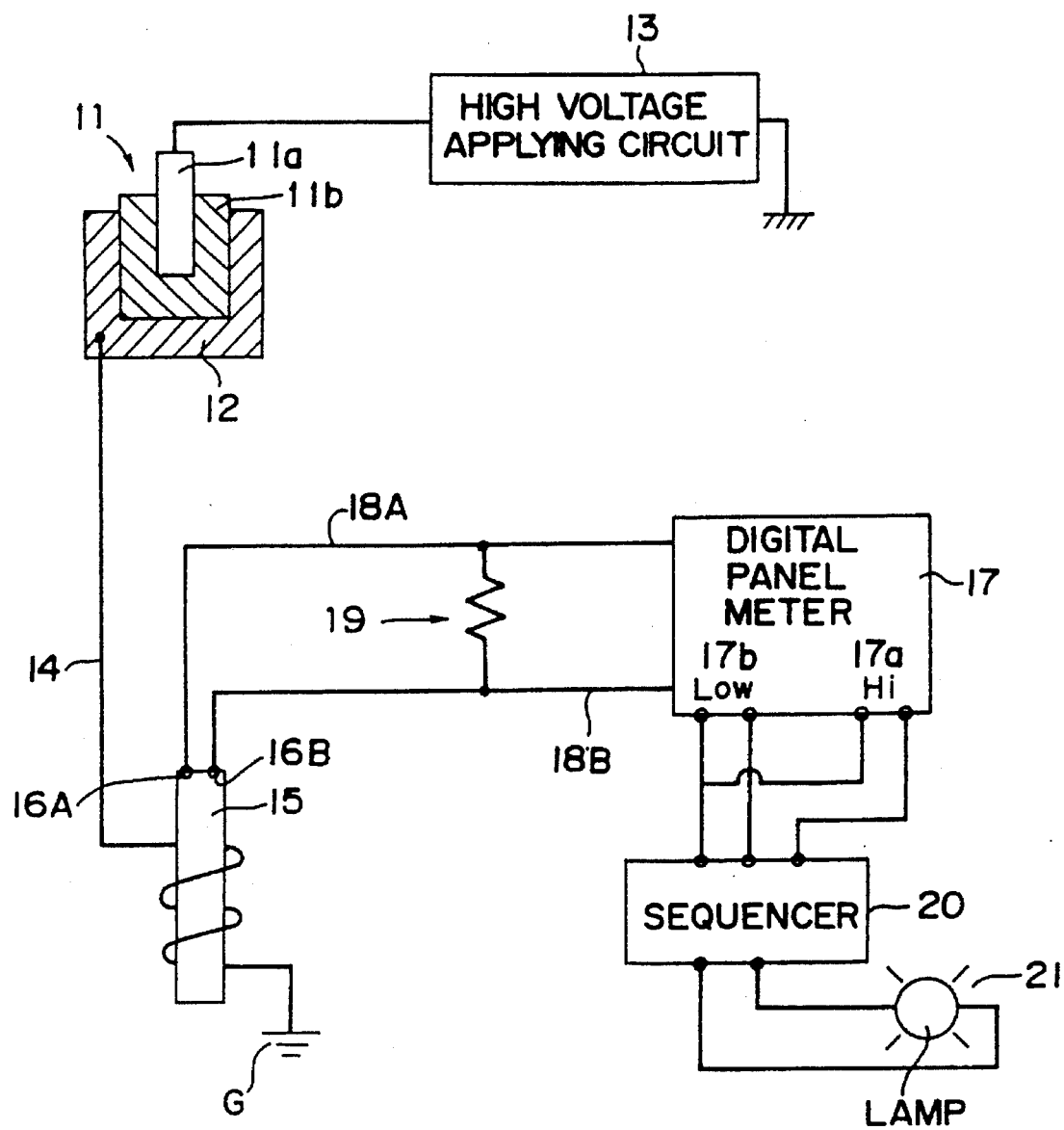
FIG. 1 is a block diagram showing a withstand voltage-testing apparatus according to an embodiment of the present invention.
Figure 3:
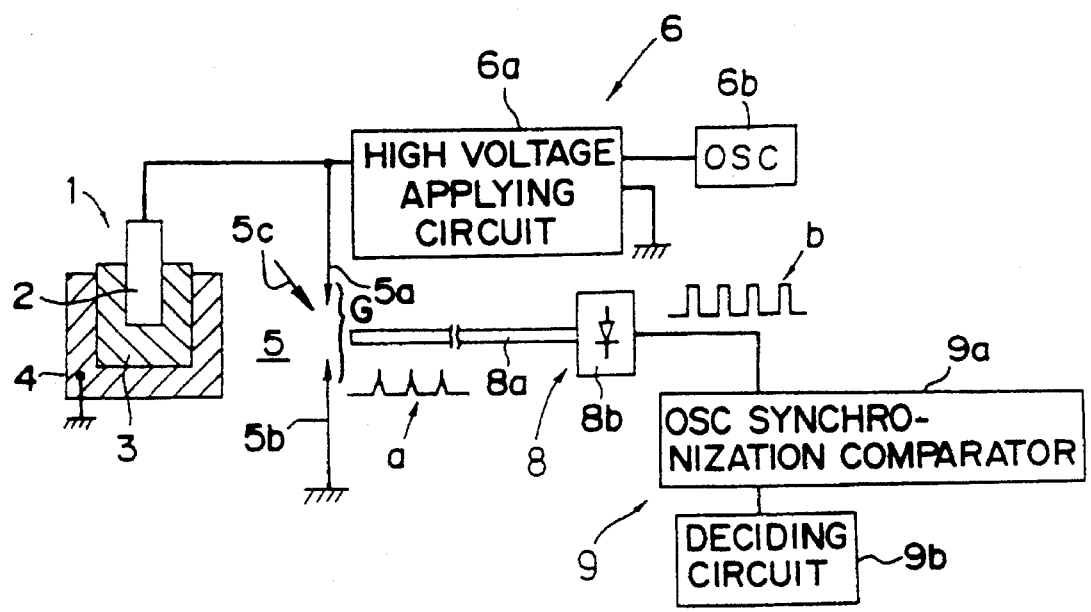
FIG. 3 is a block diagram showing a conventional withstand voltage-testing apparatus.
Figure 4:
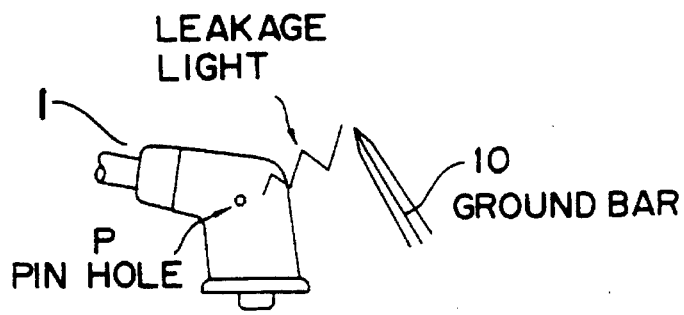
FIG. 4 is a schematic view showing a conventional method of measuring a withstand voltage.

FIG. 1 is a block diagram showing the withstand voltage-testing apparatus according to the embodiment. Similarly to the conventional withstand voltage-testing apparatus shown in FIG. 3, in a work 11, the withstand voltage of which is to be measured, a conductor 11a of the work 11 is covered with an insulating material 11b, and the insulating material 11b is surrounded with a ground conductor 12. Thus, if the insulating material 11b has a pin hole or the like formed thereon, and thus if leakage has occurred in electric current applied to the conductor 11a, leakage current flows to the ground conductor 12.

A high voltage is applied to the conductor 11a of the work 11 by a high-voltage generating means 13.

A conductor 14 connecting the ground conductor 12 to the ground G is wound around a current transformer 15 in N-turn in a required number of times.

Output terminals 16A and 16B disposed on the secondary side of the current transformer 15 are connected with a DC digital panel meter 17 via conductors 18A and 18B, respectively, and a variable resistor 19 is disposed between the conductors 18A and 18B in connection therewith. In this manner, feeble electric current generated by the current transformer 15 is converted into a voltage by the variable resistor 19, and the voltage is inputted to the DC digital panel meter 17.

Figure 2:
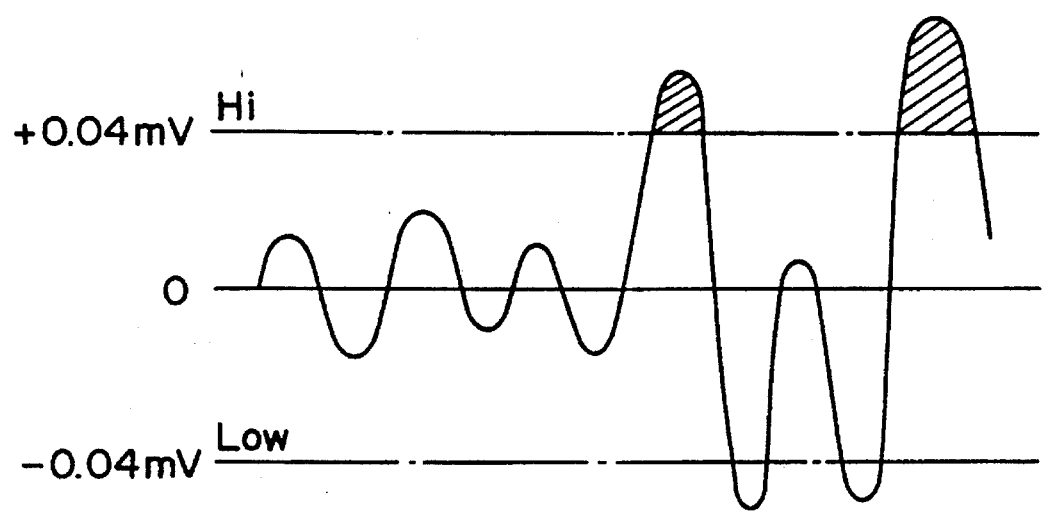
FIG. 2 is a waveform showing the operation of a digital panel meter constituting the withstand voltage-testing apparatus according to the present invention.

In the digital panel meter 17, the voltage generated by the variable resistor 19 is compared with a predetermined threshold, as shown in FIG. 2. If the voltage exceeds an upper threshold, the digital panel meter 17 outputs a signal from a High-output terminal 17a thereof to a sequencer 20 connected with the digital panel meter 17, whereas if the voltage is lower than the lower threshold, it outputs a predetermined signal from a Low-output terminal 17b thereof to the sequencer 20. The digital panel meter 17 and the sequencer 20 constitute a detector. In this embodiment, the upper threshold is set to +0.04 mV, while the lower threshold is set to −0.04 mV.

When a signal outputted from the High-output terminal 17a or the Low-output terminal 17b is inputted to the sequencer, a warning lamp 21 connected with the sequencer 20 is turned on to display that the work 1 is defective.

During the test, a high voltage generated by the high-voltage generating means 13 is applied to the work 11. When electric current has leaked through the insulating material 11b due to the formation of a pin hole or the like on the insulating material 11b, leakage current flows to the current transformer 15 through the conductor 14 and then, to the ground G. With the flow of the leakage current through the current transformer 15, secondary current is generated in the current transformer 15 in accordance with the winding number of times of the conductor 14 wound around the current transformer 15.

The feeble current can be reliably detected by the current transformer 15 by increasing the winding number of times of the conductor 14. The winding number of times of the conductor 14 is set according to the intensity of the leakage current and the rating of the current transformer 15.

The electric current outputted from the output terminals 16A and 16B disposed on the secondary side of the current transformer 15 flows through the variable resistor 19. The voltage generated in the variable resistor 19 is inputted to the digital panel meter 17 of the detector.

The voltage inputted to the digital panel meter 17 is compared with the predetermined upper and lower thresholds. If the voltage is higher than the upper threshold, the digital panel meter 17 outputs a signal from the High-output terminal 17a thereof to the sequencer 20, whereas if the voltage is lower than the lower threshold, it outputs a signal from the Low-output terminal 17b thereof to the sequencer 20.

When the signal is received by the sequencer 20, the warning lamp is turned on, thus informing the operator that the work 11 is defective.

If the insulating material 11b has no pin holes formed thereon and thus if no leakage current flows through the ground conductor 12, no electric current is generated on the secondary side of the current transformer 15, but a voltage generated due to the presence of noise is displayed on the digital panel meter 17. Because the voltage generated due to the presence of the noise is lower than the upper threshold and higher than the lower threshold, the warning lamp 20 is not turned on.

As apparent from the foregoing description, in the withstand voltage-testing apparatus according to the present invention, the current transformer detects electric current which has leaked from the work. Leakage current is inputted to the digital panel meter as a voltage proportional to the intensity of the leakage current via the resistor. Whether the work is defective or not is decided by the digital panel meter, based on the comparison between the inputted voltage and the predetermined thresholds. Thus, the withstand voltage-testing apparatus provides accurate and reliable test results.

In particular, the leakage current is converted into indirect electric current by using the current transformer, and noise which is a DC component contained in the leakage current is cut off by the current transformer. In addition, the DC digital panel meter is used as the digital panel meter. Therefore, the apparatus can be prevented from malfunctioning due to the noise.

Furthermore, the apparatus overcomes various problems of the conventional withstand voltage-testing apparatus comprising the triple-needle discharge device. That is, the voltage to be applied to the conductor of the work is 25–28 KV in the conventional withstand voltage-testing apparatus, whereas the apparatus according to the present invention can be reliably used to measure the withstand voltage of the work at a high voltage of 30 KV or more. In addition, the test voltage can be changed by adjusting the voltage to be applied to the work by the high-voltage applying means. Further, unlike the conventional method of measuring the withstand voltage by effecting discharge in atmosphere, the apparatus according to the present invention does not generate ozone or big sounds, thus not deteriorating the environment surrounding the place in which withstand voltage-measuring tests are conducted.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A withstand voltage-testing apparatus comprising:
   a high-voltage generating means for applying a high voltage to a work, a withstand voltage of which is to be measured;
   an insulating member covering said work;
   a ground conductor covering said insulating material;
   a current transformer around which a conductor connecting the ground conductor and the ground with each other is wound;
   a resistor connected with output terminals of the current transformer;
   a detector for detecting a voltage generated by the resistor; and
   a warning means for displaying that the work is defective when a voltage detected by the detector is one of higher than a predetermined upper threshold and lower than a predetermined lower threshold.

2. The withstand voltage-testing apparatus according to claim 1, wherein a variable resistor is used as the resistor.

3. The withstand voltage-testing apparatus according to claim 2, wherein the detector is composed of a DC digital panel meter and a sequencer connected with the digital panel meter; the DC digital panel meter compares a voltage inputted thereto with predetermined upper and lower thresholds, thus outputting a signal to the sequencer from a High-output terminal thereof if the voltage is higher than the upper threshold and outputting a signal to the sequencer from a Lower-output terminal thereof if the voltage is lower than the lower threshold; and when the signal is inputted to the sequencer from the High-output terminal, a lamp of the warning means connected with the sequencer is turned on.

4. The withstand voltage-testing apparatus according to claim 1, wherein the detector is composed of a DC digital panel meter and a sequencer connected with the digital panel meter; the DC digital panel meter compares a voltage inputted thereto with predetermined upper and lower thresholds, thus outputting a signal to the sequencer from a High-output terminal thereof if the voltage is higher than the upper threshold and outputting a signal to the sequencer from a Low-output terminal thereof if the voltage is lower than the lower threshold and when the signal is inputted to the sequencer from the High-output terminal, a lamp of the warning means connected with the sequencer is turned on.

* * * * *